United States Patent

[11] 3,600,629

[72] Inventors Paul Fenster
Highland Park, N.J.;
John B. Horrigan, Beverly, Mass.; Leonard Safran, Beverly, Mass.

[21] Appl. No. 875,850
[22] Filed Nov. 12, 1969
[45] Patented Aug. 17, 1971
[73] Assignee Varian Associates
Palo Alto, Calif.

[54] TUNER FOR PROVIDING MICROWAVE CROSS-FIELD TUBES WITH AN EXTENDED TEMPERATURE STABILIZED FREQUENCY RANGE
9 Claims, 4 Drawing Figs.

[52] U.S. Cl. .......... 315/39.61, 315/39.65, 313/42
[51] Int. Cl. .......... H01j 25/50
[50] Field of Search .......... 315/39.51, 39.61, 39.65, 39.59, 39.55, 333/82 BT; 313/42

[56] References Cited
UNITED STATES PATENTS

| | | | |
|---|---|---|---|
| 2,837,694 | 6/1958 | Spencer | 315/39.61 |
| 3,014,152 | 12/1961 | Shelton, Jr. | 315/39.61 |
| 3,471,744 | 10/1969 | Pryor | 315/39.61 X |
| 3,478,246 | 11/1969 | Perkins et al. | 315/39.61 X |

*Primary Examiner*—Eli Lieberman
*Assistant Examiner*—Saxfield Chatmon, Jr.
*Attorneys*—Stanley Z. Cole and Gerald L. Moore

ABSTRACT: A rising-sun magnetron tube is disclosed employing a composite tuning ring structure axially translatable in an end space region adjacent the open ends of the anode resonators. The composite tuning ring includes a pair of conductive rings separated by a ceramic insulator. In a preferred embodiment the conductive ring facing the anode circuit is disposed in axial registration with the back wall of the small anode resonators and has a radial width less than that of the other ring. The resultant tuner has increased tuning range and a more linear tuning rate to facilitate temperature compensation.

PATENTED AUG 17 1971

3,600,629

INVENTORS
PAUL FENSTER
JOHN B. HORRIGAN
LEONARD SAFRAN

BY Gerald L. Moore
ATTORNEY

TUNER FOR PROVIDING MICROWAVE CROSS-FIELD TUBES WITH AN EXTENDED TEMPERATURE STABILIZED FREQUENCY RANGE

DESCRIPTION OF THE PRIOR ART

Heretofore, rising-sun magnetron oscillators have been tuned by an axially translatable conductive ring disposed in the end space region of the circuit adjacent the open ends of the anode resonators. The tuner was inductive and had substantial tuning range, as from 16.0to 16.8GHz. However, one of the problems with this prior tuner was that the tuning rate, i.e., slope of the curve of frequency versus distance from the circuit, varied by a factor of 10to 1over the tuning range of the tube. This relatively large variation in the tuning rate made it impractical to obtain temperature compensation for the tube because the temperature dependent compensator was required to produce widely different compensating displacements of the tuner over the tuning range. Therefore, it was desirable to obtain a tuner having a comparable tuning range with a substantially more linear tuning rate.

SUMMARY OF THE PRESENT INVENTION

The principal object of the present invention is the provision of an improved tuner for crossed-field tubes.

One feature of the present invention is the provision of a composite tuning structure having a pair of conductive members separated by a dielectric member, whereby the tuning range and linearity of the tuning rate are increased.

Another feature of the present invention is the same as any or more of the preceding features wherein the width of the conductive member facing the anode circuit is substantially less than the corresponding width of the other conductive tuning member.

Another feature of the present invention is the same as any one or more of the preceding features wherein the tuner includes a temperature compensating structure.

Other features and advantages of the present invention will become apparent upon a perusal of the following specification taken in connection with the accompanying drawings wherein:

DESCRIPTION OF THE PREFERRED EMBODIMENTS

Figures 1, 2, 3, 4:
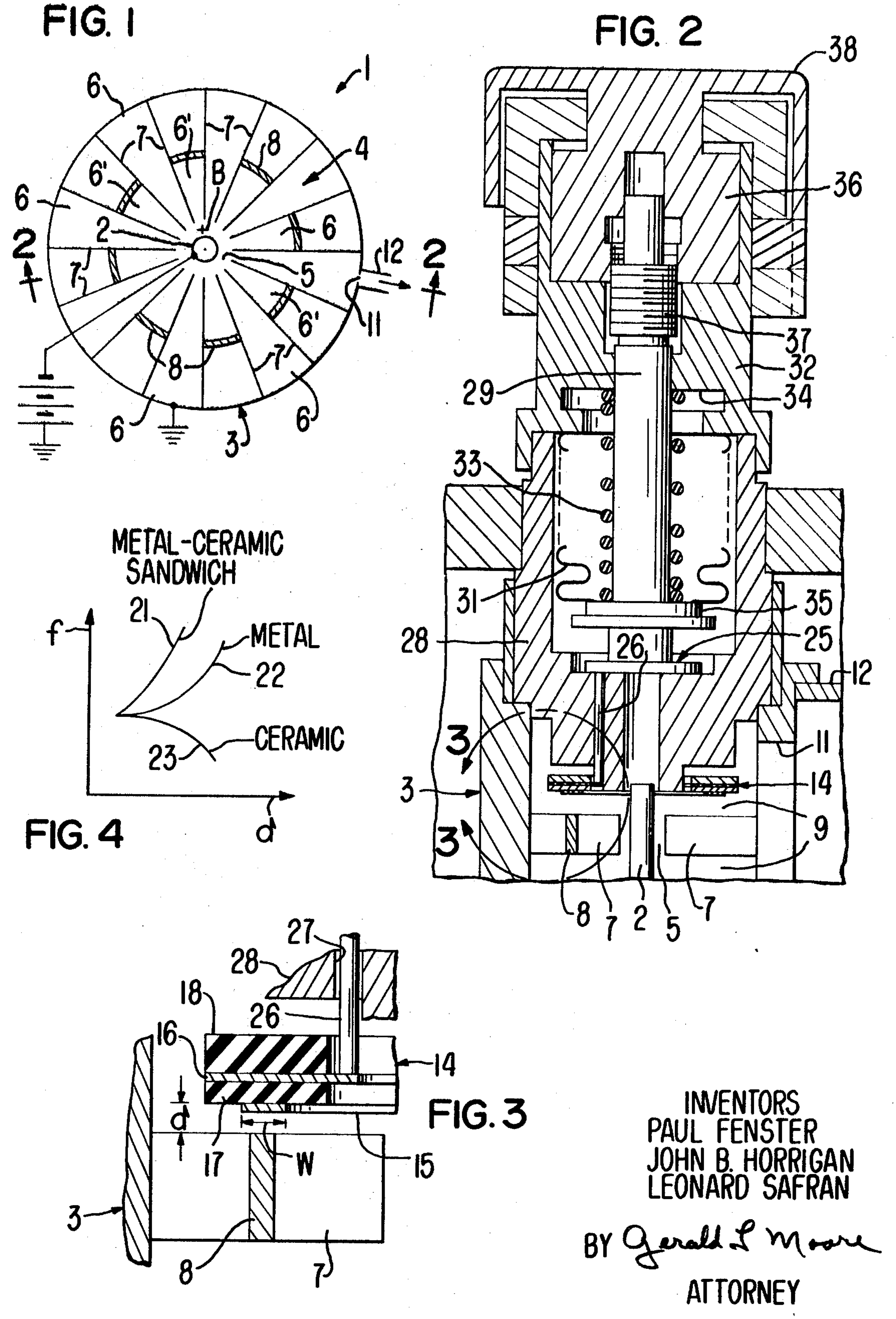
FIG. 1 is a transverse, cross-sectional, schematic line diagram of a rising-sun magnetron incorporating features of the present invention.
FIG. 2 is an enlarged fragmentary sectional view of a portion of the structure of FIG. 1 taken along line 2–2 in the direction of the arrows.
FIG. 3 is an enlarged detail view of a portion of the structure of FIG. 2 delineated by line 3–3.
FIG. 4 is a plot of frequency versus tuner displacement from the microwave circuit and depicting tuning characteristics for metal, ceramic, and metal-ceramic sandwich tuners.

Referring now to FIG. 1, there is shown a rising-sun magnetron oscillator tube 1. The tube 1 includes a centrally disposed cathode emitter electrode 2 surrounded concentrically by an anode electrode structure 3. The anode electrode structure 3 includes a microwave circuit portion 4 facing the cathode electrode 2 to define an annular crossed-field interaction region 5 in the annular region between the anode 3 and the cathode 2.

The microwave circuit portion 4 of the anode electrode 3 includes a circular array of anode resonators 6 defined in the spaces between adjacent radially directed conductive vane members 7. Alternate resonators 6′ include conductive back wall members 8 interconnecting adjacent vane member 7 at a point approximately one-half of the radial extent of the vane members 7 to define a rising-sun microwave circuit. The rising-sun microwave circuit is characterized by an array of resonators 6 with alternate resonators 6′ having substantially smaller size (radial extent) than the intervening larger resonators 6. The anode resonators 6 and 6′ open radially into the interaction region 5 and open at opposite axial ends into end space regions 9 (see FIG. 2) defined at opposite axial ends of the array of anode resonators 6 and 6′.

In operation, electrons circulating about the cathode 2 in the interaction region 5 interact with microwave energy on the circuit 4 to convert DC power into microwave energy which is extracted from the tube 1 via an output iris 11 and waveguide 12 communicating with the circuit 4 through the back wall of one of the large resonators 6. The output waveguide 12 feeds the microwave energy to a suitable utilization device, such as an antenna, not shown.

The frequency of the output microwave energy is changed by tuning the microwave circuit 4 by means of a tuner, shown in detail in FIGS. 2 and 3. More particularly, the tuner includes a composite sandwich tuning ring structure 14 which is axially translatable in one of the end regions 9 adjacent the open ends of the array of anode resonators 6 and 6′ for variable displacing microwave fields on the circuit 4.

The composite tuning ring structure 14 includes first and second axially spaced conductive copper ring members 15 and 16, respectively, having a ring of dielectric insulative material 17, such as alumina ceramic, sandwiched therebetween. A backup ring 18 of insulative dielectric material, such as alumina ceramic, is affixed to the back side of the second conductive ring 16. The composite tuning ring structure is held together, as by brazed metallized joints, at the interfaces between the adjacent metal and ceramic members 15, 17, 16, and 18.

In a preferred embodiment, the first conductive ring 15 has a radial width $w$ substantially less than the radial width of the second conductive member 16 and the dielectric member 17 has an axial thickness substantially greater than the thickness of the first conductive member 15. This causes the microwave circuit opposed area of the first member 15 to be substantially less than the circuit opposed area of the second conductive member 16. The first conductive member is also preferably disposed in axial registration with the back wall 8 of the smaller anode resonators 6′. By so proportioning such ceramic and conductive ring members 15, 16 and 17, the tuning curve 21 (see FIG. 4) of the composite ceramic and metal sandwich 15, 16 and 17 is caused to have a substantially steeper slope to provide a greater tuning range than prior art all metal or metal backed ceramic tuning rings, the tuning curves for which are shown by curves 22 and 23, respectively, of FIG. 4. Moreover, the resultant tuning curve 21 for the sandwich tuner 14 is much more linear, i.e., has a more linear tuning rate, which greatly facilitates temperature compensation of the tube 1 over its entire tuning range. Such temperature compensation is conventionally obtained by producing a compensating temperature dependent displacement of the tuner 14 to offset temperature dependent changes in the dimensions of the microwave circuit 4. The temperature compensating structure and its mode of operation is more fully described below.

The backup ceramic ring 18 has little or no electrical effect on the tuning characteristic of the sandwich tuner 14. The backup ring 18 stiffens the sandwich 14 and serves to stress relieve the metallized joint between ceramic ring 17 and the second metal ring 16. The first conductive ring 15 need not have a reduced radial width compared to that of the second ring 16. However, by so proportioning the radial widths of rings 15 and 16 a more linear tuning rate is achieved.

In a typical example of the sandwich tuner 14 operable in the tuning range of 16to 17GHz. of a rising-sun magnetron, the first ring member 15 had a thickness of 0.003inch and a width of 0.110inch, the ceramic members 17 and 18 each had a thickness of 0.020inches and a width of 0.220inch, and the second conductive member 16 had a thickness of 0.003inch and a width of 0.220inch. The vanes 7 had a radial extent of approximately 0.410inch. Over the tuning range, the spacing $d$ from the first conductive member 15 to the adjacent microwave circuit 4 varied from 0.003inch to 0.080inch. The tuning rate for the sandwich tuner 14 varied by a factor of only 4 over its entire tuning range thereby making temperature compensation practical, whereas the prior art metal tuner had a tuning rate which varied by a factor of 10 over a comparable tuning range.

The sandwich tuner ring 14 is carried on the inner end of a spider 25. The spider includes a plurality of axially directed metal legs 26, as of stainless steel, which pass axially through axially directed bores 27 in a magnetic pole piece 28, as of soft iron. The spider is carried on the end of an axially directed elongated tuner actuating rod 29 which is sealed in a vacuum tight manner to the body of the tube 1 via a metallic bellows 31, as of stainless steel.

A hollow cylindrical tuner adapter member 32 is affixed to the pole piece 28 and extends coaxially of the tuner rod 29. A spring 33 is positioned coaxially of the tuner rod 29 and bears at its outer end against an inwardly directed centrally apertured flange portion 34 of the tuner adapter 32. The inner end of the spring 33 bears against a collar 35 affixed to the tuner rod 29 for spring biasing the tuner rod inwardly of the tube 1.

A tuning nut 36, captured against axial translation, bears against flange portion 34 and is threadably mated with threads 37 on a threaded portion of the tuner rod 29. Rotation of nut 36 via a knob 38 affixed thereto produces axial translation of the tuner rod 29 and dependent sandwich tuner ring 14 for tuning of the tube 1. The tuner rod 29 is captured against rotation by bellows 31 and spider legs 26.

Temperature compensation for the tube 1 is achieved by making the tuner rod 29 of a material having a different coefficient of thermal expansion than that of the support structure including housing member 32 and pole piece 28. In this manner, as the temperature of the microwave circuit 4 increases, thereby lowering its operating frequency, the tuner ring 14 is caused to move away from the circuit 4 by an amount to produce a substantially equal temperature dependent frequency adjustment of the opposite sense. In the tube 1 of the present invention, the temperature coefficient was linearized and reduced to 0.01MHz./° C. over a tuning range from 16.1GHz. to 16.4GHz.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

We claim:

1. In a microwave tube, means forming a cathode electrode structure, means forming an anode electrode structure spaced from cathode electrode, said anode electrode structure having a microwave circuit portion facing said cathode, means for producing crossed electric and magnetic fields in the region between said anode and cathode electrodes to define a crossed-field interaction region therebetween, means for extracting microwave energy from said microwave circuit, means for tuning said microwave circuit, said tuning means includes a composite tuning structure having first and second conductive members with a dielectric member disposed therebetween, said dielectric member causing said conductive members to be substantially totally electrically isolated from one another, said composite tuning structure being disposed with said first conductive member facing said anode microwave circuit, and means for translating said composite tuning structure adjacent said circuit in the microwave fields of said anode circuit for tuning said circuit.

2. The apparatus of claim 1 wherein said first and second conductive members of said composite tuning structure are dimensioned such that said first conductor member has an area facing said anode circuit which is less than the area of said second conductive member facing said anode circuit.

3. The apparatus of claim 1 wherein said dielectric member of said tuning structure has a thickness substantially greater than the thickness of said first conductive member.

4. The apparatus of claim 1 wherein said anode electrode is substantially concentrically disposed of said cathode electrode to define an annular crossed-field interaction region, and said anode microwave circuit including an array of resonators opening radially into said interaction region and opening axially into end regions at opposite axial ends of said array of resonators, and wherein said composite tuning structure is disposed in one of said end regions adjacent one of the axial ends of said array of resonators, and wherein said means for translating said composite tuning structure translates said tuning structure in the axial direction.

5. The apparatus of claim 4 wherein said composite tuning structure is annular.

6. The apparatus of claim 4 wherein said array of resonators includes alternate resonators of substantially shorter radial extent than the radial extent of the intervening resonators of said array to define a rising-sun type magnetron anode microwave circuit.

7. The apparatus of claim 6 wherein said first conductive member of said composite tuning structure has a radial extent substantially less than the radial extent of said resonators of larger radial extent, and wherein said first conductive member is disposed substantially in axial registration with the back walls of said resonators of smaller radial extent.

8. The apparatus of claim 6 wherein said tuner means includes temperature compensating means for producing a minute temperature dependent translation of said composite tuning structure to compensate for temperature dependent changes in the resonant frequency of said microwave anode circuit.

9. The apparatus of claim 6 wherein said first conductive member of said composite tuning structure is annular.